(12) United States Patent
Gandhi et al.

(10) Patent No.: US 8,750,410 B2
(45) Date of Patent: Jun. 10, 2014

(54) MULTI-BAND POWER AMPLIFIER DIGITAL PREDISTORTION SYSTEM AND METHOD

(75) Inventors: Hardik P. Gandhi, Mountain View, CA (US); Lei Ding, Plano, TX (US); Zigang Yang, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 687 days.

(21) Appl. No.: 12/888,191

(22) Filed: Sep. 22, 2010

(65) Prior Publication Data

US 2012/0069931 A1 Mar. 22, 2012

(51) Int. Cl.
*H04L 25/49* (2006.01)
*H04L 27/36* (2006.01)
*H04L 27/00* (2006.01)

(52) U.S. Cl.
USPC ............ 375/296; 375/295; 375/318; 375/297

(58) Field of Classification Search
USPC ............... 375/219, 220, 222, 240.26–240.29, 375/295, 296, 316, 318, 319, 346, 350
See application file for complete search history.

(56) References Cited

U.S. PATENT DOCUMENTS

| | | | |
|---|---|---|---|
| 7,170,344 B2 | 1/2007 | Suzuki et al. | |
| 7,313,373 B1 | 12/2007 | Laskharian et al. | |
| 7,634,238 B2 | 12/2009 | Suzuki et al. | |
| 2003/0179829 A1* | 9/2003 | Pinckley et al. | 375/295 |
| 2008/0130789 A1* | 6/2008 | Copeland et al. | 375/297 |
| 2010/0316157 A1* | 12/2010 | Bassam et al. | 375/267 |
| 2011/0235749 A1* | 9/2011 | Kenington | 375/296 |

* cited by examiner

*Primary Examiner* — Sam K Ahn
*Assistant Examiner* — Linda Wong
(74) *Attorney, Agent, or Firm* — Alan A. R. Cooper; W. James Brady, III; Frederick J. Telecky, Jr.

(57) ABSTRACT

Traditionally, for multi-band communication systems, independent signal chains for each of the different bands are employed. By using such an architecture, there are a large number of components, and there is substantial power consumption. Here, transmit processor is provided that enables transmission across multiple bands using few components (namely, fewer signal chains), while also provided for digital predistortion.

17 Claims, 7 Drawing Sheets

MULTI-BAND POWER AMPLIFIER DIGITAL PREDISTORTION SYSTEM AND METHOD

TECHNICAL FIELD

The invention relates generally to wireless or wireline communications and, more particularly, to digital predistortion within a transmit processor.

BACKGROUND

Many communications standards support employ multiple bands. One example is the Time Domain Synchronous Code Division Multiple Access (TD-SCDMA). TD-SCDMA typically employs three bands: A-Band (1880 MHz-1920 MHz); B-Band (2010 MHz-2025 MHz with up to 9 carriers); and C-Band (2300-2400 MHz, which is targeted for TD-LTE). As a result, base station transceivers (BTS), in order to be compliant with the applicable multi-band standard, need to support one or more of these bands, which is typically accomplished through the use of separate transmit chains for each band.

Turning to FIG. 1, a conventional system 100, which employs separate transmit/receive chains for each band, can be seen. System 100 generally comprises a transmit processor 102, a signal processor 104, transceiver pipelines 106-1 to 106-N, coupler 126, antenna 128, switch 130, mixer 132, and analog-to-digital converter (ADC) 134. Each of these transmit pipelines 106-1 to 106-2 respectively comprises digital-to-analog converters (DAC) 108-1 to 108-N and 110-1 to 110-N, a modulator 114-1 to 114-N, lower power amplifiers (LPA) 116-1 to 116-N and 124-1 to 124-N, a high power amplifier (HPA) 118-1 to 118-N, a coupler 120-1 to 120-N, a mixer 122-1 to 122-N, and an ADC 112-1 to 112-N. In operation, the baseband signal BB (which may be in any one of the supported bands) is converted to a radio frequency (RF) signal and transmitted through antenna 128, with each of the transceiver pipelines 106-1 to 106-N being configured to support one of the supported bands.

Clearly, it can be observed that this type of implementation uses a large number of components and uses a considerable amount of power, so it is desirable to reuse circuitry for multiple bands. The simple solution would be to simply combine all of the transmit pipelines 106-1 to 106-N into a signal pipeline, but there are some problems with reusing circuitry that lie with the digital predistortion (DPD) correction, which is provided by transmit processor 102. Typically, the transmit processor 102 (which may comprise multiple processors) receives feedback from each transmit pipeline 106-1 to 106-N and performs DPD correction for the nonlinearities of each of the HPAs 118-1 to 118-N separately.

Turning to FIG. 2, an example of a transmit processor 102 can be seen. Transmit processor 102 generally performs baseband processing with the digital upconverter (DUC) circuit 202 and crest factor reduction (CFR) circuit 204, resulting in a processed signal. This processed baseband signal is predistorted by the DPD circuit 206 to generate the output signal OUT. The DPD adaptive engine 208 can then receive feedback FB and adjust the DPD circuit 206. Typically, this type of DPD uses a rate that is five to seven times the bandwidth of a band, so, for example, with the combined A-Band and B-Band of TD-SCDMA, there is a total bandwidth 145 MHz (1880 MHz-2025 MHz), which indicates that the DPD circuit (i.e., 206) will generally operate between 725 MHz and 1050 MHz. This type of DPD bandwidth would, then, generally employ a feedback ADC (i.e., ADC 134) that operates at 1.45 GHz, which is prohibitively fast and which renders this simple solution infeasible. Moreover, this very wide bandwidth is prohibitive fast due the need for a significant amount of digital support hardware.

Therefore, there is a need for a transmit processor that is able to perform DPD corrections for multiple bands that reuses circuitry for each band.

Some other conventional circuits are: U.S. Pat. Nos. 7,170, 344; 7,313,373; and 7,634,238.

SUMMARY

A preferred embodiment of the present invention, accordingly, provides an apparatus. The apparatus comprises a plurality of digital predistortion (DPD) pipelines that each receive at least one of a plurality of input signals, wherein each input signal is associated with at least one of a plurality of bands, and wherein each DPD pipeline includes: a baseband processing circuit that receives its input signal and generates a processed signal; a plurality of cross-modulation DPD circuits, wherein each cross-modulation DPD circuit receives the processed signal from at least one of the remaining DPD pipelines so as to calculate cross-modulation corrections between its band and a remaining band; an inter-modulation DPD circuit that receives the processed signal from its baseband processing circuit so as to calculate an inter-modulation correction for its band; a mix-and-sum circuit that receives outputs from each of the DPD pipelines; and an adaptive DPD engine that provides adaptive DPD data to each of the DPD pipelines.

In accordance with a preferred embodiment of the present invention, each inter-modulation DPD circuit further comprises: a squared modulus circuit that receives the processed signal from its baseband processing circuit and that generates a squared modulus signal; and an inter-modulation lookup table (LUT) that receives the processed signal from its baseband processing circuit and the squared modulus signal from its squared modulus circuit.

In accordance with a preferred embodiment of the present invention, each cross-modulation DPD circuit further comprises a cross-modulation LUT that receives the squared modulus signal from its squared modulus circuit and that receives the processed signal from at least one of the remaining DPD pipelines.

In accordance with a preferred embodiment of the present invention, the mix-and-sum circuit further comprises: a plurality of mixing circuits, wherein each mixing circuit is associated with at least one of the DPD pipelines, and wherein each mixing circuit includes: an inter-modulation mixer that receives an output from its inter-modulation LUT; and cross-modulation that receives an output from at least one of its cross-modulation LUTs; and a summing circuit that receives an output from each of the inter-modulation mixers and from each of the cross-modulation mixers.

In accordance with a preferred embodiment of the present invention, the mix-and-sum circuit further comprises a block upconverter (BUC) that is interposed between: its baseband processing circuit and its cross-modulation DPD circuits; and its baseband processing circuit and its inter-modulation DPD circuit.

In accordance with a preferred embodiment of the present invention, the each DPD pipeline further comprises a plurality of BUCs that are each interposed between: at least one of the inter-modulation mixers and the summing circuit; or at least one of the cross-modulation mixers and the summing circuit.

In accordance with a preferred embodiment of the present invention, the summing circuit further comprises a plurality of summing circuits, wherein each summing circuit is associated with at least one of the mixing circuits, and wherein each summing circuit receives an output from its inter-modulation mixer and outputs from the cross-modulation mixers from each of the remaining mixing circuits.

In accordance with a preferred embodiment of the present invention, the apparatus further comprises a processor with the DPD pipelines implemented as software thereon.

In accordance with a preferred embodiment of the present invention, an apparatus is provided. The apparatus comprises a transmit processor that receives a first input signal and a second input signal, wherein the first input signal is associated with a first band, and wherein the second input signal is associated with a second band, and wherein the transmit processor includes: a first DPD pipeline having: a first baseband processing circuit that receives the first input signal and generates a first processed signal; a first cross-modulation DPD circuit; and a first inter-modulation DPD circuit that receives the first processed signal; a second DPD pipeline having: a second baseband processing circuit that receives the second input signal and generates a second processed signal, wherein the second processed signal is provided to the first cross-modulation DPD circuit; a second cross-modulation DPD circuit that receives the first processed signal; and a second inter-modulation DPD circuit that receives the second processed signal; a mix-and-sum circuit that receives outputs from each of the DPD pipelines; and an adaptive DPD engine that provides adaptive DPD data to each of the DPD pipelines; a transmit circuit that is coupled to transmit processor so as to receive an output of the mix-and-sum circuit; an amplifier that is coupled to the transmit circuit; a feedback circuit that is coupled to the amplifier and the transmit processor; and an oscillator circuit that is coupled to the transmit circuit and the feedback circuit.

In accordance with a preferred embodiment of the present invention, the first inter-modulation DPD circuit further comprises: a first squared modulus circuit that receives the first processed signal and that generates a first squared modulus signal; and a first inter-modulation LUT that receives the first processed signal and the first squared modulus signal; and the second inter-modulation DPD circuit further comprises: a second squared modulus circuit that receives the second processed signal and that generates a second squared modulus signal; and a second inter-modulation LUT that receives the second processed signal and the second squared modulus signal.

In accordance with a preferred embodiment of the present invention, the first cross-modulation DPD circuit further comprises a first cross-modulation LUT that receives the first squared modulus signal and that receives the second processed signal, and wherein the second cross-modulation DPD circuit further comprises a second cross-modulation LUT that receives the second squared modulus signal and that receives the first processed signal.

In accordance with a preferred embodiment of the present invention, the mix-and-sum circuit further comprises: a first mixing circuit having: a first inter-modulation mixer that receives an output from the first inter-modulation LUT; and a first cross-modulation mixer that receives an output from the first cross-modulation LUT; a second mixing circuit having: a second inter-modulation mixer that receives an output from the second inter-modulation LUT; and a first cross-modulation mixer that receives an output from the second cross-modulation LUT; and a summing circuit that receives an output from the first and second inter-modulation mixers and the first and second cross-modulation mixers.

In accordance with a preferred embodiment of the present invention, the summing circuit further comprises: a first summing circuit that receives an output from the first inter-modulation mixer and the second cross-modulation mixer; and a second summing circuit that receives an output from the second inter-modulation mixer and the first cross-modulation mixer.

In accordance with a preferred embodiment of the present invention, the apparatus further comprises a processor with the first and second DPD pipelines implemented as software thereon.

In accordance with a preferred embodiment of the present invention, the oscillator circuit further comprises: a local oscillator circuit that generates a first local oscillator signal that is associated with the first band and a second local oscillator signal that is associated with the second band, wherein the first local oscillator signal is provided to the transmit circuit; and a multiplexer that is coupled to the local oscillator circuit and the feedback circuit so as to provide at least one of the first and second local oscillator signals to the feedback circuit based on a selection of the first and second bands.

In accordance with a preferred embodiment of the present invention, an apparatus is provided. The apparatus comprises a transmit processor that receives a first input signal and a second input signal, wherein the first input signal is associated with a first band, and wherein the second input signal is associated with a second band, and wherein the transmit processor includes: a first DPD pipeline having: a first baseband processing circuit that receives the first input signal and generates a first processed signal; a first cross-modulation DPD circuit; and a first inter-modulation DPD circuit that receives the first processed signal; a second DPD pipeline having: a second baseband processing circuit that receives the second input signal and generates a second processed signal, wherein the second processed signal is provided to the first cross-modulation DPD circuit; a second cross-modulation DPD circuit that receives the first processed signal; and a second inter-modulation DPD circuit that receives the second processed signal; a mix-and-sum circuit that receives outputs from each of the DPD pipelines; and an adaptive DPD engine that provides adaptive DPD data to each of the DPD pipelines; a transmit circuit that is coupled to transmit processor so as to receive an output of the mix-and-sum circuit, wherein the transmit circuit includes: an first digital-to-analog converter (DAC) that receives an in-phase portion of the output of the mix-and-sum circuit; a second DAC that receives a quadrature portion of the output of the mix-and-sum circuit; a modulator that is coupled to the first and second DACs; and a low power amplifier that is coupled to the modulator; a high power amplifier that is coupled to lower power amplifier; a feedback circuit having: a feedback mixer that is coupled to the high power amplifier; an analog-to-digital converter (ADC) that is coupled to the feedback mixer and the transmit processor; and an oscillator circuit having: a local oscillator circuit that generates a first local oscillator signal that is associated with the first band and a second local oscillator signal that is associated with the second band, wherein the local oscillator circuit is coupled to the modulator so as to provide at least one of the first and second local oscillator signals to the modulator; and a multiplexer that is coupled to the local oscillator circuit and the feedback mixer so as to at least one of the first and second local oscillator signals to the feedback mixer based on a selection of the first and second bands.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
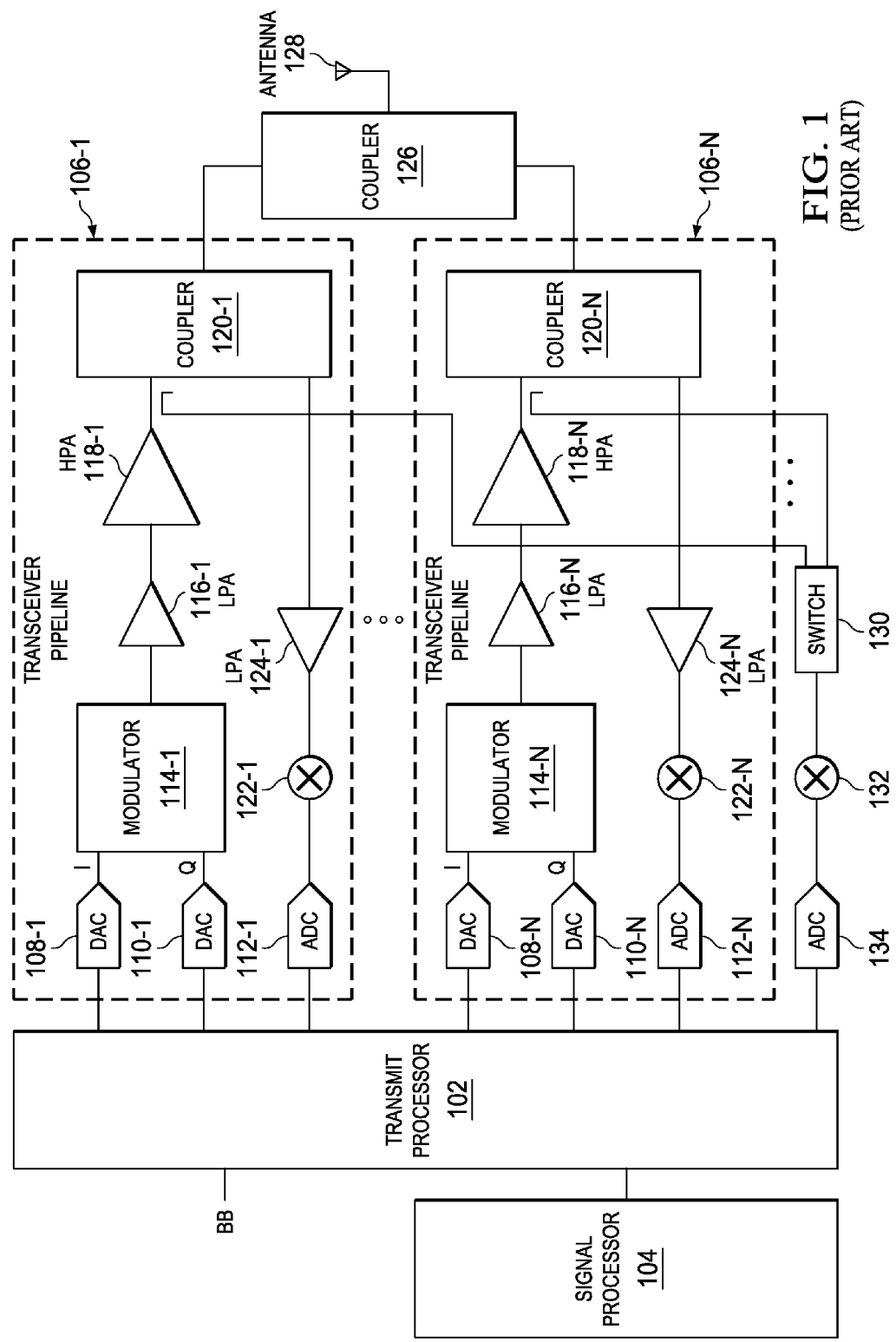
FIG. 1 is a block diagram of an example of a conventional system for transmitting signals in multiple bands.
Figure 2:
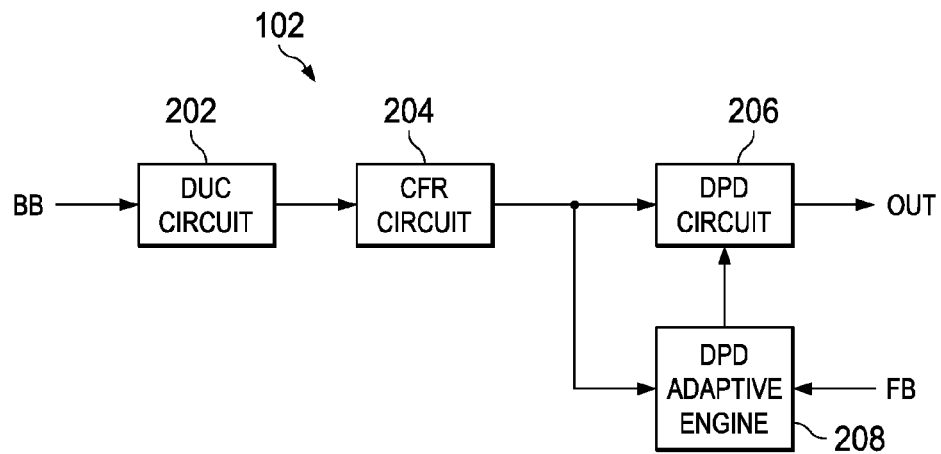
FIG. 2 is a block diagram of the transmit processor of FIG. 1.

Refer now to the drawings wherein depicted elements are, for the sake of clarity, not necessarily shown to scale and wherein like or similar elements are designated by the same reference numeral through the several views.

Figure 3:
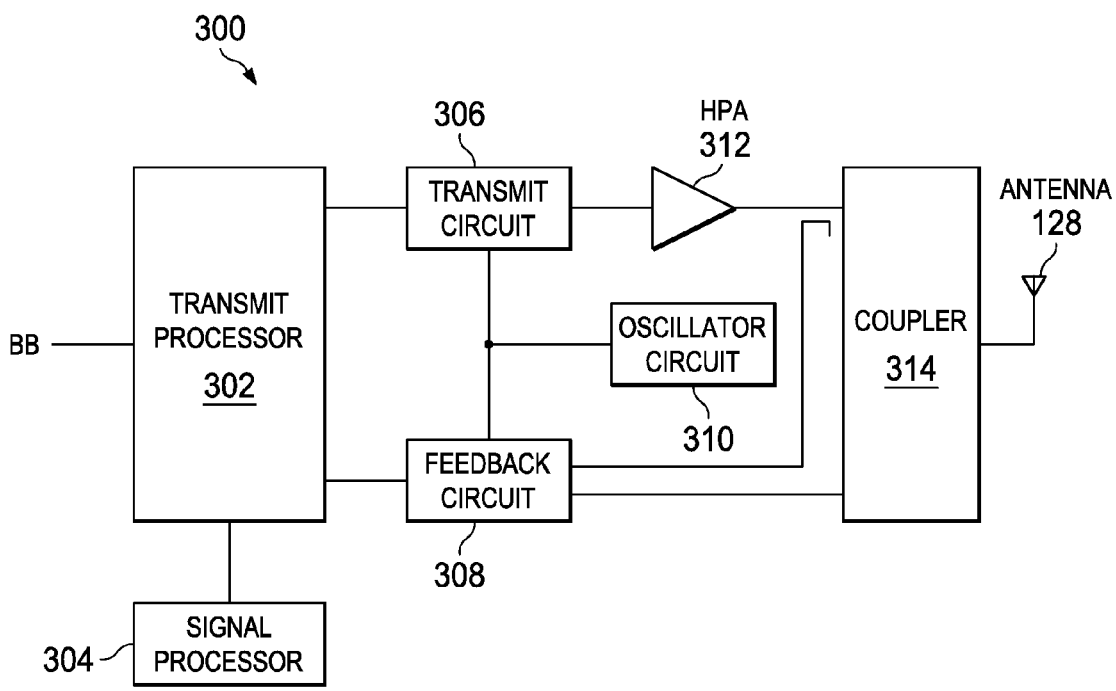
FIG. 3 is a block diagram of an example of a system for transmitting signals in multiple bands in accordance with a preferred embodiment of the present invention.

In FIG. 3, a system 300 in accordance with a preferred embodiment of the present invention can be seen. System 300, as opposed to system 100, generally employs a single signal chain for multiple bands. Preferably, system 300 comprises a transmit processor 302, a signal processor (such as a digital signals processor or DSP) 304, a transmit circuit 306, a feedback circuit 308, an oscillator circuit 310, an HPA 312, a coupler 314, and an antenna 128. In operation, transmit processor 302 receives an input signal BB (which may be in any one of the supported bands), and the system 300 processes, predistorts, and converts the input signal to RF for transmission through antenna 128.

Figure 4:
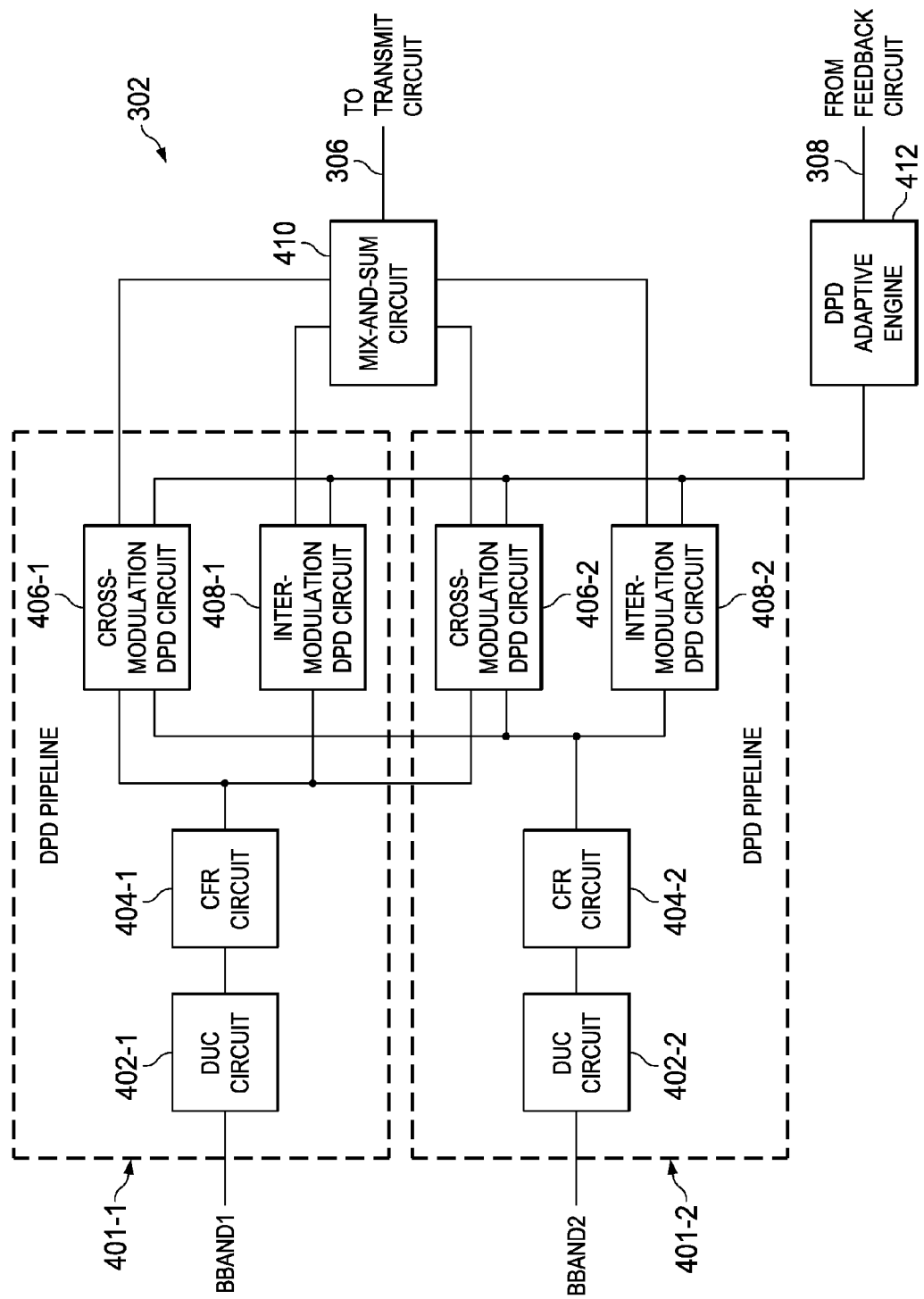
FIG. 4 is a block diagram of an example of the transmit processor of FIG. 3.

Turning to FIG. 4, the transmit processor 302 can be seen in greater detail. For the sake of simplicity of illustration, a transmit process 302 that support two bands is shown; however, support for more bands is possible because the system 300 is scalable. In this example, transmit processor 302 includes DPD pipelines 401-1 and 401-2 (typically one pipeline for each band) that receives a respective input signal BBAND1 and BBAND2, a mix-and-sum circuit 410 that combines outputs from each pipeline 401-1 and 401-2, and an DPD adaptive engine 412 that adjusts the DPD for each pipeline 401-1 and 401-2. Additionally and similar to transmit processor 102, each pipeline 401-1 and 401-2 has a baseband processing circuit that respectively includes a DUC circuit 402-1 and 402-2 and a CFR circuit 404-1 and 404-2 that generates a processed signal for each pipeline 401-1 and 401-2. DPD pipelines 401-1 and 401-2 (or any portion thereof) as well as mix-and-sum circuit 410 and DPD adaptive engine 412 can be implement in hardware or in software embodied on a processor.

As can be seen, DPD is performed individually on each band and then the post-DPD signals are combined for transmission through HPA 312. A problem with this configuration, however, is that there is not only inter-modulation distortion caused by the nonlinear response of HPA 312 with each band, but there is also cross-modulation distortion between the bands. To compensate for these two distortions, each pipeline 401-1 and 401-2 respectively includes cross-modulation DPD circuits 406-1 or 406-2 (which calculate and compensate for cross-modulation distortion between the bands) and an inter-modulation DPD circuit 408-1 or 408-2 (which calculates and compensates for inter-modulation distortion for each band). Each of the pairs of modulation circuits 406-1/408-1 and 406-2/408-2 can be formed of separate circuits or can be combined in a single circuit. Each of these cross-modulation DPD circuits 406-1 and 406-2 and the inter-modulation DPD circuits 408-1 and 408-2 are discussed in greater detail below.

To understand the effects of inter-modulation and cross-modulation terms, a conventional memoryless third order nonlinear model can be considered, as an example. This model can be represented as follows:

$$y = a_1 x + a_3 x |x|^2, \quad (1)$$

where x is an input, y is an output, and $a_1$ and $a_3$ are model coefficients. For a two-band input signal, the input x can be represented as:

$$x = x_1 + x_2, \quad (2)$$

where $x_1$ is associated with band 1 and $x_2$ is associated with band 2. Combining equations (1) and (2), the resultant output y for a two-band input signal is:

$$y = a_1 x_1 + a_1 x_2 + a_3 (x_1 + x_2) |x_1 + x_2|^2 \quad (3)$$
$$= y_1 + y_2 + y_3,$$

where $y_1$, $y_2$, and $y_3$ are:

$$y_1 = a_1 x_1 + a_3 x_1 |x_1|^2 + 2 a_3 x_1 |x_2|^2 \quad (4)$$

$$y_2 = a_1 x_2 + a_3 x_2 |x_2|^2 + 2 a_3 x_2 |x_1|^2 \quad (5)$$

$$y_3 = a_3 x_1^2 x_2^* + a_3 x_2^2 x_1^* \quad (6)$$

It should be noted that $y_1$ is located around $x_1$ (band 1), $y_2$ is located around $x_2$ (band 2), and $y_3$ is away from band 1 and band 2. If a conventional DPD is used on just band 1 (for example), the DPD correction $y_{DPD}$ is:

$$y_{DPD} = a_1 x_1 + a_3 x_1 |x_1|^2 \quad (7)$$

As shown, all terms in equation (7) are generated from $x_1$, which are regarded as inter-modulation terms for band 1. Comparing equation (7) with equation (4), the terms alone cannot address nonlinear distortions when passing both band 1 and band 2 through HPA 312. Under these circumstances, DPD should use cross-modulation terms, which involves both $x_1$ and $x_2$, such as $x_1$ and $|x_2|^2$ term in $y_1$. This analysis can be extended to higher order nonlinear system or nonlinear systems with memory, but regardless of the order or type of system, this analysis shows that for multiband DPD systems, both inter-modulation and cross-modulation terms should be used to compensate for nonlinear distortions in each of the signal bands.

Figure 5:
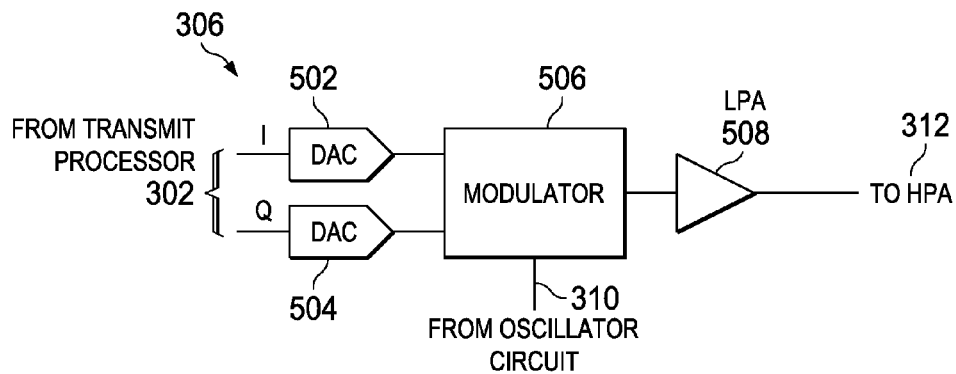
FIG. 5 is a block diagram of an example of the transmit circuit of FIG. 3.
Figure 6:
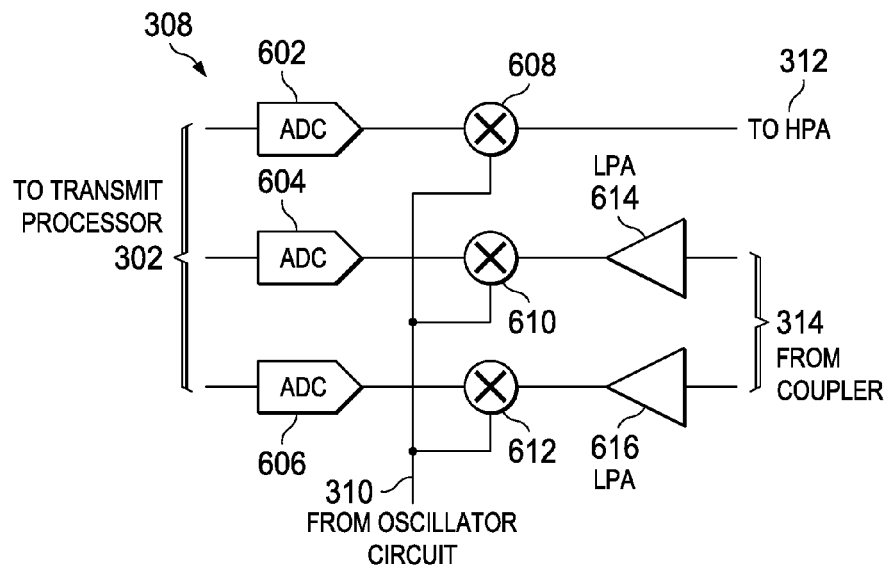
FIG. 6 is a block diagram of an example of the feedback circuit of FIG. 3.

Now, turning to FIGS. 5 and 6, the transmit circuit 306 and feedback circuit 308 can be seen in greater detail. Here, the feedback circuit 308 operates to provide feedback for performing DPD as well as a receive function, so as to operate as a transceiver. Within transmit circuit 306, a pair of DACs 502 and 504 receives the in-phase (I) and the quadrature (Q) portions of the signal output from the transmit processor 302 (which is typically predistorted). The analog I and Q signals are provided to modulator 506 (which is typically an IQ modulator) that generates an RF signal. This RF signal is then provided to LPA 508. The amplified RF signal can then be provided to HPA 312 for transmission through antenna 128. The feedback mixer 608 of feedback circuit 308 receives the output of HPA 312, and the output of mixer 608 is converted to a digital feedback signal by ADC 602, so that the DPD adaptive engine 412 can adjust pipelines 401-1 and 401-2 accordingly. Additionally, feedback circuit 308 includes LPAs 614 and 616, mixers 610 and 612, and ADCs 604 and 606, which provide receive signals (for its receive function) to transmit processor 302. Preferably, the feedback circuit 308 enables the transmit processor 302 to capture multiple feedback signal in hardware (i.e., capture buffers) for further processing (i.e., DPD).

Figure 7:
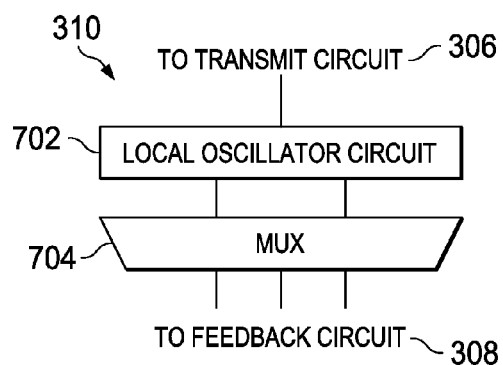
FIG. 7 is a block diagram of an example of the oscillator circuit of FIG. 3.

In order to provide transmission in each band, however, different local oscillator signals may need to be provided to various mixers within the transmit circuit 306 and the feedback circuit 310. These local oscillator signals are provided by the oscillator circuit 310, which can be seen in greater detail in FIG. 7. As shown, oscillator circuit 310 generally comprises a local oscillator circuit 702 (which generates a local oscillator signal for each band) and a multiplexer 704. Typically, one of the local oscillator signals is provided to the modulator 506 from the local oscillator circuit 702, and one oscillator output is provided to the mixers 608 based on the band selection with multiplexer 704. Two other oscillator output are provided to the mixer 610 and 612 to cover two different receiver band. Preferably, the band selection (or tuning of HPA 312) is performed through software, thus, enabling transmit processor 302 to capture one set of feedback signals for each setting of the oscillator circuit 310, where each setting corresponds to one of the bands.

Figure 8:
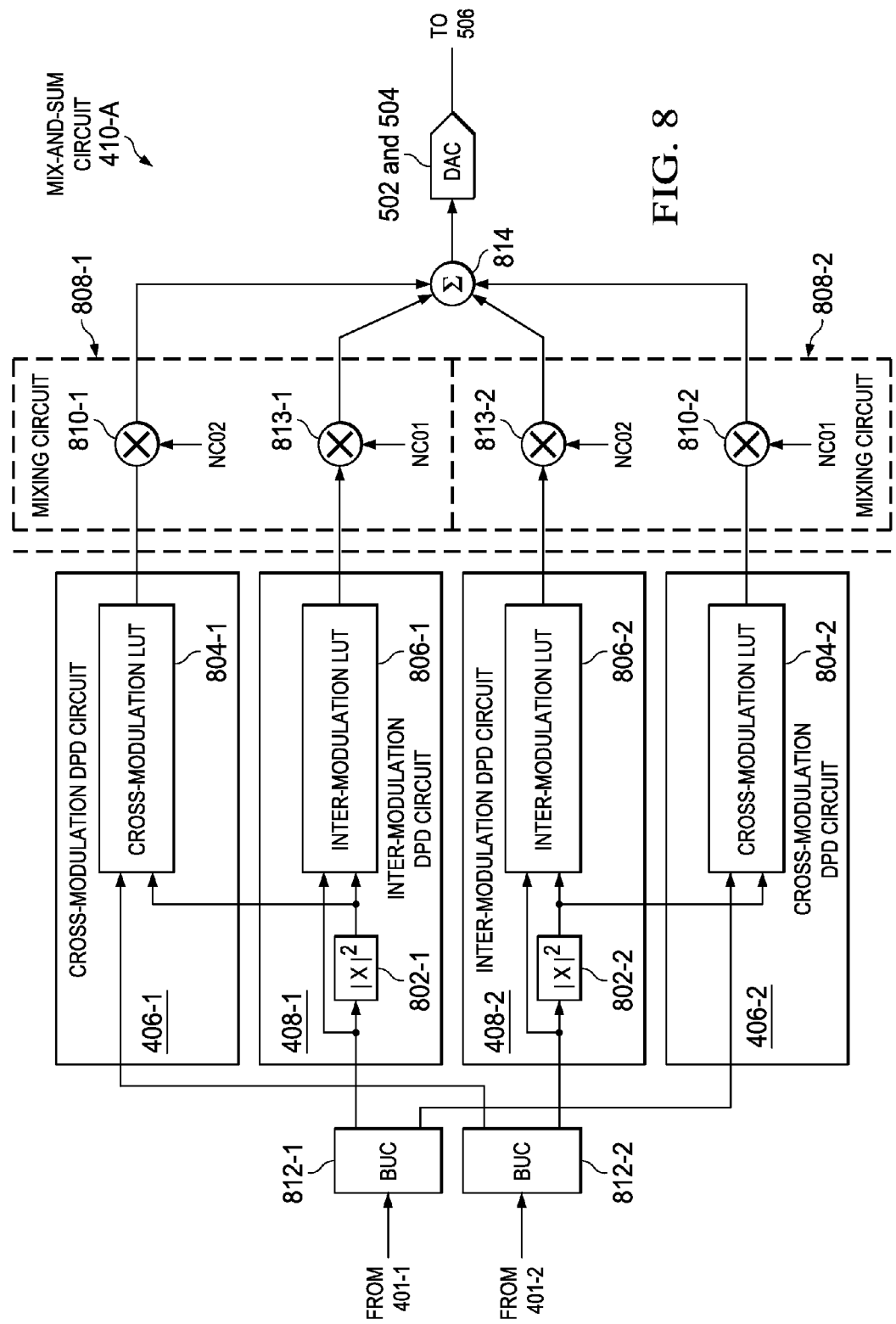
FIGS. 8 through 10 are block diagrams of examples of the DPD circuitry of FIG. 4.
Figure 9:
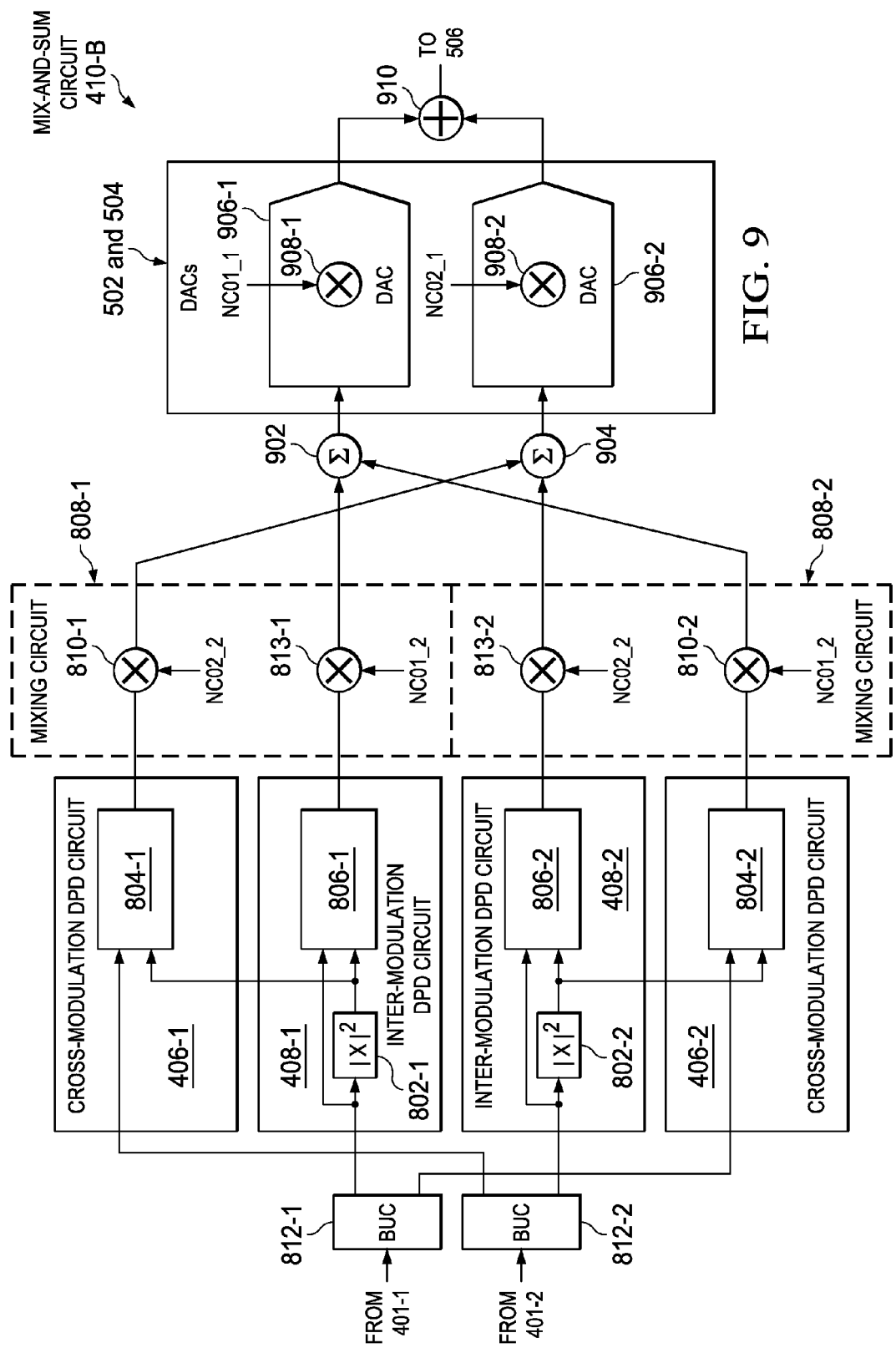
Figure 10:
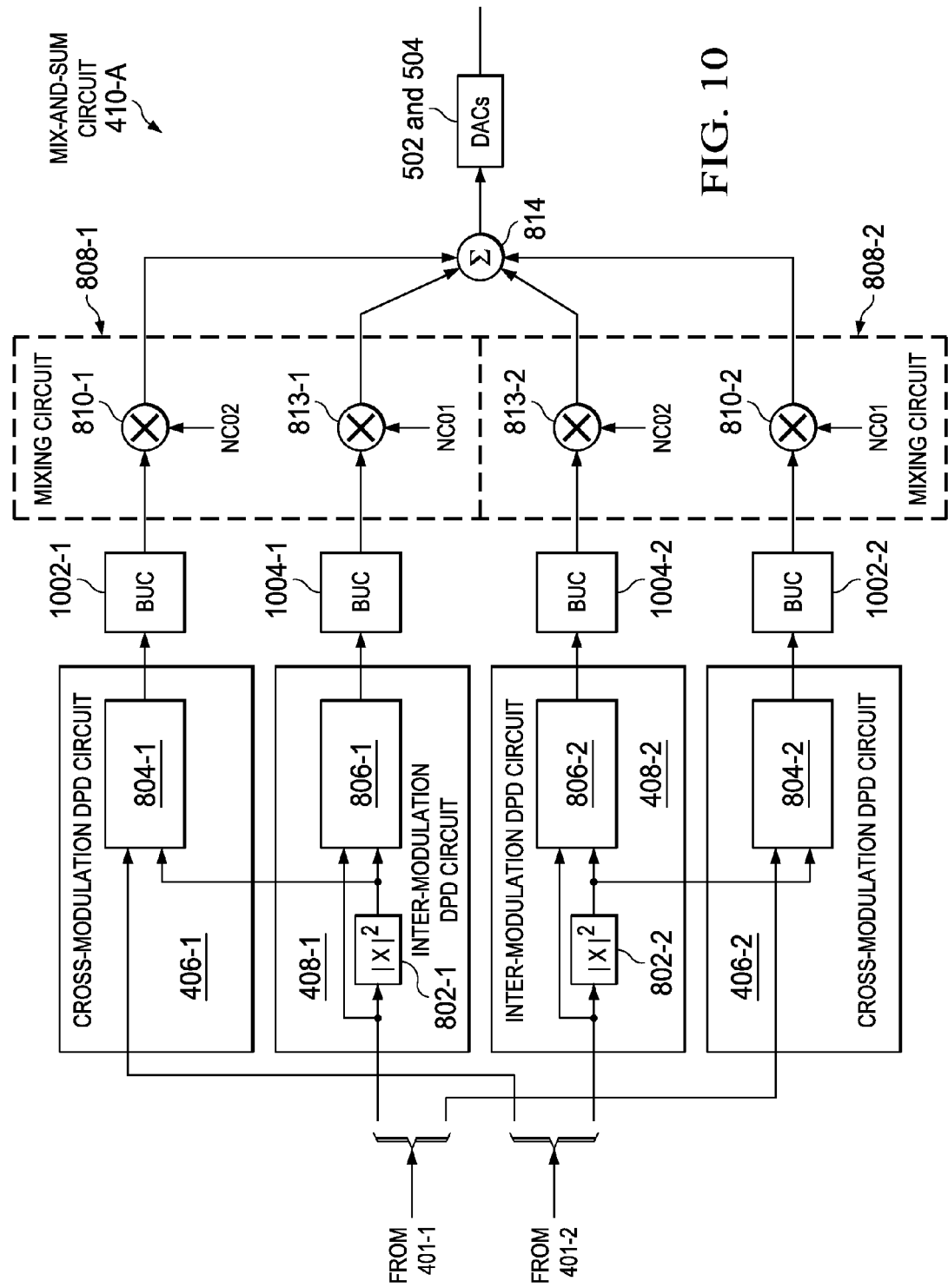

Turning now to FIGS. 8-10, the DPD circuitry (which generally includes the cross-modulation DPD circuits 406-1 and 406-2, inter-modulation DPD circuits 408-1 and 408-2, and mix-and-sum circuit 410) can be seen in greater detail. Each of the cross-modulation DPD circuits 406-1 and 406-2, inter-modulation DPD circuits 408-1 and 408-2 are preferably comprised of, for example, parallel Volterra, memory polynomial, or Weiner-Hammerstein based predistorters. Namely, each inter-modulation DPD circuit 406-1 and 406-2 respectively includes a squared modulus circuit 802-1 or 802-1 and an inter-modulation lookup table (LUT) 806-1 or 806-2, while each cross-modulation DPD circuit 406-1 and 406-2 respectively include a cross-modulation LUT 804-1 or 804-2. The squared modulus circuit 802-1 and 802-2 provide outputs to their respective cross-modulation LUT 804-1 or 804-2 and inter-modulation LUT 806-1 or 806-2 to perform these predistortions. Alternatively, the sum of squared modulus circuits 802-1 and 802-2 may be used for LUTs 804-1 and 804-2. In yet another alternative, two-dimensional LUTs can be used for 804-1, 804-2, 806-1, and 806-2. The DPD circuitry, however, can then be arranged in one of several ways to achieve the desired result; as examples, three arrangements are described herein.

For the first example arrangement of the DPD circuitry (which can be seen in FIG. 8), block upconverters (BUCs) 812-1 and 812-2 are employed for each band. Preferably, BUC 812-1 provides an output to squared modulus circuit 802-1 and cross-modulation LUT 804-2, while BUC 812-2 provides an output to squared modulus circuit 802-2 and cross-modulation LUT 804-1. BUCs 812-1 and 812-2 each perform a 2× interpolation, and mix-and-sum circuit 410-A is employed, where each of the DPD pipelines 401-1 and 401-2 is respectively associated with a mixing circuit 808-1 or 808-2. These mixing circuit 808-1 and 808-2 include cross-modulation mixers 810-1 and 810-2 (which mix output from cross-modulation LUTs 804-1 and 804-2 with numerically controlled oscillator signals NCO2 and NCO1, respectively) and inter-modulation mixers 813-1 and 813-2 (which mix output from inter-modulation LUTs 806-1 and 806-2 with numerically controlled oscillator signals NCO1 and NCO2, respectively). Numerically controlled oscillator signals NCO1 and NCO2 are also each associated with bands BBAND1 and BBAND2, respectively. The outputs of mixing circuits 808-1 and 808-2 are summed by summing circuit 814. Alternatively, the outputs of circuits 408-1/406-2 and 408-2/406-1 may be summed prior to mixing to reduce the number of mixers (i.e., 810-1).

A drawback for this arrangement is that there is a tradeoff between signal bandwidth and nonlinearity order. If one were to assume (for the sake of illustration) that: (1) the CFR circuits 404-1 to 404-N operate at 38.4 MSPS input and 76.8 MSPS output; and (2) a DPD operates at 153.6 MSPS, the DPD adaptive engine 412 can provide corrections to five nonlinear LUTs through 12 equalization taps. Because the tuning range for the numerically controlled oscillator signals NCO1 and NCO2 is generally limited by signal bandwidth and nonlinearity order, and assuming the signal bandwidth can be limited to 20 MHz and third order nonlinearity, the numerically controlled oscillator signals NCO1 and NCO2 could be tuned to within 45 MHz of each other, having a 90 MHz separation between carrier bands.

For the second example arrangement of the DPD circuitry (which can be seen in FIG. 9), it is similar to the first example arrangement, except for the mix-and-sum circuit 410-B. Namely, mixing circuits 810-1 and 810-2 have been removed, and summing circuit 814 has been replaced with summing circuits 902 and 904. Here, each of summing circuits 902 and 904, respectively, combine an output from inter-modulation mixers 813-1 and 813-2 with an output from cross-modulation mixers 810-2 and 810-1. A complexity with this arrangement, however, is that DACs 502 and 504 are each replaced with a pair of DACs 906-1 and 906-2 and a summing circuit 910. DACs 906-1 and 906-2 each includes a mixer 908-1 or 908-2, that mix the signals with numerically controlled oscillator signals NCO1_1 and NCO2_1, respectively, in the digital domain. Typically, numerically controlled oscillator signals NCO1_1 and NCO2_1 provided to mixers 908-1 and 908-2 can be coarse (i.e., $F_s/8$ or $3F_s/8$). To achieve an arbitrary mixing effect of numerically controlled oscillator signals NCO_1 and NCO_2, the numerically controlled oscillator signals NCO1_2 and NCO2_2, which can be fine resolution, is introduced to the mixing circuits 808-1 and 808-2. It should be noted that the sum of numerically controlled oscillator signals NCO1_1 and NCO1_2 is numerically controlled oscillator signal NCO1 and that the sum of numerically controlled oscillator signals NCO2_1 and NCO2_2 is numerically controlled oscillator signal NCO2. The output from DACs 906-1 and 906-2 is combined then by summing circuit 910. A reason for using this arrangement is that is allows for improved performance; namely, the second arrangement does not suffer from the same drawback as the first. With the same assumptions used for the example for the first arrangement above, a full 30 MHz band width with five times correction on each band can be supported, with a separation of 100 MHz or more (limited by the sample rates of DACs 906-1 and 906-2).

Turning now to the third example arrangement (which can be seen in FIG. 10), it is similar to the first example arrangement, except for the BUCs 812-1 and 812-2 (which have been replaced with BUCs 1002-1/1004-1 and 1002-2/1004-2). These BUCs 1002-1/1004-1 and 1002-2/1004-2 are coupled between the DPD circuits 406-1, 406-2, 408-1, and 408-2 and mixing circuits 808-1 and 808-2 and can perform a 3× interpolation, allowing the sample rates of DACs 502 and 504 to be high (i.e., 230 MSPS for the assumptions made with respect to the example for the first arrangement). As a result, there is full flexibility with respect to band separation (i.e., up to 100 MHz for the assumptions made with respect to the example for the first arrangement). But, due to limited DPD sample rates (i.e., 76.8 MSPS) the signal bandwidth is limited (i.e., 15-20 MHz.).

Therefore, several advantages can be realized with system 300. For example, there is a substantially reduced cost because the number of signal chains (and number of corresponding components) can be reduced. Additionally, because there are fewer idle components during operation (due to the reduced number of signal chains), the power consumption can be greatly reduced.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
a plurality of digital predistortion (DPD) pipelines that each receive at least one of a plurality of input signals, wherein each input signal is associated with at least one of a plurality of bands, and wherein each DPD pipeline includes:
a baseband processing circuit that receives an input signal from the plurality of input signals and generates a processed signal;
a cross-modulation DPD circuit, wherein the cross-modulation DPD circuit receives the processed signal from at least one of the remaining DPD pipelines so as to calculate cross-modulation corrections between a band of the cross-modulation DPD circuit and a remaining band;
an inter-modulation DPD circuit that receives the processed signal from the baseband processing circuit so as to calculate an inter-modulation correction for a band of the inter-modulation DPD circuit;
a mix-and-sum circuit that receives outputs from each of the DPD pipelines; and an adaptive DPD engine that provides adaptive DPD data to each of the DPD pipelines;
wherein each inter-modulation DPD circuit in the plurality of DPD pipelines further comprises:
a squared modulus circuit that receives the processed signal from the baseband processing circuit and that generates a squared modulus signal; and
an inter-modulation lookup table (LUT) that receives the processed signal from the baseband processing circuit and the squared modulus signal from the squared modulus circuit; and
wherein each cross-modulation DPD circuit in the plurality of DPD pipelines further comprises a cross-modulation LUT that receives the squared modulus signal from the squared modulus circuit and that receives the processed signal from at least one of the remaining DPD pipelines.

2. The apparatus of claim 1, wherein the mix-and-sum circuit further comprises:
a plurality of mixing circuits, wherein each mixing circuit is associated with at least one of the DPD pipelines, and wherein each mixing circuit includes:
an inter-modulation mixer that receives an output from the inter-modulation LUT; and
a cross-modulation mixer that receives an output from the cross-modulation LUT; and
a summing circuit that receives an output from each of the inter-modulation mixers and from each of the cross-modulation mixers.

3. The apparatus of claim 2, wherein the mix-and-sum circuit further comprises a block upconverter (BUC) that is interposed between:
the baseband processing circuit and the cross-modulation DPD circuits of the DPD pipeline; and
the baseband processing circuit and the inter-modulation DPD circuits of the DPD pipeline.

4. The apparatus of claim 2, wherein the each DPD pipeline further comprises a plurality of BUCs that are each interposed between:
at least one of the inter-modulation mixers and the summing circuit; or
at least one of the cross-modulation mixers and the summing circuit.

5. The apparatus of claim 2, wherein the summing circuit further comprises a plurality of summing circuits, wherein each summing circuit of the plurality of summing circuits is associated with at least one of the mixing circuits, and wherein each summing circuit of the plurality of summing circuits receives an output from the inter-modulation mixer and outputs from the cross-modulation mixers from each of the remaining mixing circuits.

6. The apparatus of claim 1, wherein the apparatus further comprises a processor with the DPD pipelines implemented as software thereon.

7. An apparatus comprising:
a transmit processor that receives a first input signal and a second input signal, wherein the first input signal is associated with a first band, and wherein the second input signal is associated with a second band, and wherein the transmit processor includes:
a first DPD pipeline having:
a first baseband processing circuit that receives the first input signal and generates a first processed signal;
a first cross-modulation DPD circuit; and
a first inter-modulation DPD circuit that receives the first processed signal;
a second DPD pipeline having:
a second baseband processing circuit that receives the second input signal and generates a second processed signal, wherein the second processed signal is provided to the first cross- modulation DPD circuit;
a second cross-modulation DPD circuit that receives the first processed signal; and
a second inter-modulation DPD circuit that receives the second processed signal;

a mix-and-sum circuit that receives outputs from each of the DPD pipelines; and
an adaptive DPD engine that provides adaptive DPD data to each of the DPD pipelines;
a transmit circuit that is coupled to transmit processor so as to receive an output of the mix-and-sum circuit;
an amplifier that is coupled to the transmit circuit;
a feedback circuit that is coupled to the amplifier and the transmit processor;
an oscillator circuit that is coupled to the transmit circuit and the feedback circuit,
wherein: the first inter-modulation DPD circuit further comprises:
a first squared modulus circuit that receives the first processed signal and that generates a first squared modulus signal; and
a first inter-modulation LUT that receives the first processed signal and the first squared modulus signal; and
the second inter-modulation DPD circuit further comprises:
a second squared modulus circuit that receives the second processed signal and that generates a second squared modulus signal; and
a second inter-modulation LUT that receives the second processed signal and the second squared modulus signal,
wherein the first cross-modulation DPD circuit further comprises a first cross-modulation LUT that receives the first squared modulus signal and that receives the second processed signal, and wherein the second cross-modulation DPD circuit further comprises a second cross-modulation LUT that receives the second squared modulus signal and that receives the first processed signal.

8. The apparatus of claim 7, wherein the mix-and-sum circuit further comprises:
a first mixing circuit having:
a first inter-modulation mixer that receives an output from the first inter-modulation LUT; and
a first cross-modulation mixer that receives an output from a second cross-modulation LUT;
a second mixing circuit having:
a second inter-modulation mixer that receives an output from the second inter-modulation LUT; and
a first cross-modulation mixer that receives an output from the second cross-modulation LUT; and
a summing circuit that receives an output from the first and second inter-modulation mixers and the first and second cross-modulation mixers.

9. The apparatus of claim 8, wherein the summing circuit further comprises:
a first summing circuit that receives an output from the first inter-modulation mixer and the second cross-modulation mixer; and
a second summing circuit that receives an output from the second inter-modulation mixer and the first cross-modulation mixer.

10. The apparatus of claim 7, wherein the apparatus further comprises a processor with the first and second DPD pipelines implemented as software thereon.

11. The apparatus of claim 7, wherein the oscillator circuit further comprises:
a local oscillator circuit that generates a first local oscillator signal that is associated with the first band and a second local oscillator signal that is associated with the second band, wherein the first local oscillator signal is provided to the transmit circuit; and a multiplexer that is coupled to the local oscillator circuit and the feedback circuit so as to provide at least one of the first and second local oscillator signals to the feedback circuit based on a selection of the first and second bands.

12. An apparatus comprising:
a transmit processor that receives a first input signal and a second input signal, wherein the first input signal is associated with a first band, and wherein the second input signal is associated with a second band, and wherein the transmit processor includes:
a first DPD pipeline having:
a first baseband processing circuit that receives the first input signal and generates a first processed signal;
a first cross-modulation DPD circuit; and
a first inter-modulation DPD circuit that receives the first processed signal;
a second DPD pipeline having:
a second baseband processing circuit that receives the second input signal and generates a second processed signal, wherein the second processed signal is provided to the first cross- modulation DPD circuit;
a second cross-modulation DPD circuit that receives the first processed signal; and
a second inter-modulation DPD circuit that receives the second processed signal;
a mix-and-sum circuit that receives outputs from each of the DPD pipelines; and
an adaptive DPD engine that provides adaptive DPD data to each of the DPD pipelines;
a transmit circuit that is coupled to transmit processor so as to receive an output of the mix-and-sum circuit, wherein the transmit circuit includes:
an first digital-to-analog converter (DAC) that receives an in-phase portion of the output of the mix-and-sum circuit;
a second DAC that receives a quadrature portion of the output of the mix-and-sum circuit;
a modulator that is coupled to the first and second DACs; and
a low power amplifier that is coupled to the modulator;
a high power amplifier that is coupled to lower power amplifier;
a feedback circuit having:
a feedback mixer that is coupled to the high power amplifier;
an analog-to-digital converter (ADC) that is coupled to the feedback mixer and the transmit processor; and
an oscillator circuit having:
a local oscillator circuit that generates a first local oscillator signal that is associated with the first band and a second local oscillator signal that is associated with the second band, wherein the local oscillator circuit is coupled to the modulator so as to provide at least one of the first and second local oscillator signals to the modulator; and
a multiplexer that is coupled to the local oscillator circuit and the feedback mixer so as to at least one of the first and second local oscillator signals to the feedback mixer based on a selection of the first and second bands.

13. The apparatus of claim 12, wherein:
the first inter-modulation DPD circuit further comprises:
a first squared modulus circuit that receives the first processed signal and that generates a first squared modulus signal; and
a first inter-modulation LUT that receives the first processed signal and the first squared modulus signal; and the second inter-modulation DPD circuit further comprises:
- a second squared modulus circuit that receives the second processed signal and that generates a second squared modulus signal; and
- a second inter-modulation LUT that receives the second processed signal and the second squared modulus signal.

14. The apparatus of claim 13, wherein the first cross-modulation DPD circuit further comprises a first cross-modulation LUT that receives the first squared modulus signal and that receives the second processed signal, and wherein the second cross-modulation DPD circuit further comprises a second cross-modulation LUT that receives the second squared modulus signal and that receives the first processed signal.

15. The apparatus of claim 14, wherein the mix-and-sum circuit further comprises:
- a first mixing circuit having:
  - a first inter-modulation mixer that receives an output from the first inter-modulation LUT; and
  - a first cross-modulation mixer that receives an output from the first cross-modulation LUT;
- a second mixing circuit having:
  - a second inter-modulation mixer that receives an output from the second inter-modulation LUT; and
  - a first cross-modulation mixer that receives an output from the second cross-modulation LUT; and
- a summing circuit that receives an output from the first and second inter-modulation mixers and the first and second cross-modulation mixers.

16. The apparatus of claim 15, wherein the summing circuit further comprises:
- a first summing circuit that receives an output from the first inter-modulation mixer and the second cross-modulation mixer; and
- a second summing circuit that receives an output from the second inter-modulation mixer and the first cross-modulation mixer.

17. The apparatus of claim 16, wherein the apparatus further comprises a processor with the first and second DPD pipelines implemented as software thereon.

\* \* \* \* \*